(12) United States Patent
Pu et al.

(10) Patent No.: US 9,224,859 B1
(45) Date of Patent: Dec. 29, 2015

(54) HIGH VOLTAGE METAL-OXIDE-SEMICONDUCTOR TRANSISTOR DEVICE

(71) Applicant: UNITED MICROELECTRONICS CORP., Hsin-Chu (TW)

(72) Inventors: Shih-Chieh Pu, New Taipei (TW); Ming-Tsung Lee, Yilan County (TW); Cheng-Hua Yang, Hsinchu (TW); Nien-Chung Li, Hsin-Chu (TW); Wen-Fang Lee, Hsinchu (TW); Chih-Chung Wang, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/590,957

(22) Filed: Jan. 6, 2015

(30) Foreign Application Priority Data

Nov. 26, 2014 (TW) .............................. 103141053 A

(51) Int. Cl.
  *H01L 29/78* (2006.01)
  *H01L 29/417* (2006.01)
  *H01L 29/772* (2006.01)
  *H01L 29/10* (2006.01)
  *H01L 29/08* (2006.01)

(52) U.S. Cl.
  CPC ........ *H01L 29/7816* (2013.01); *H01L 29/0869* (2013.01); *H01L 29/0886* (2013.01); *H01L 29/1095* (2013.01)

(58) Field of Classification Search
  None
  See application file for complete search history.

(56) References Cited

U.S. PATENT DOCUMENTS

| 5,055,896 | A  | * | 10/1991 | Williams et al. .............. 257/409 |
| 8,723,258 | B2 |   | 5/2014  | Nakaya |
| 2010/0200922 | A1 | * | 8/2010 | Sheu .................... H01L 27/0259 257/360 |
| 2012/0280316 | A1 | * | 11/2012 | Lin et al. ........................ 257/335 |
| 2013/0093010 | A1 | * | 4/2013  | Huang et al. .................. 257/335 |
| 2013/0168767 | A1 | * | 7/2013  | Lin et al. ........................ 257/337 |
| 2015/0162439 | A1 | * | 6/2015  | Hoentschel et al. .......... 257/335 |

* cited by examiner

*Primary Examiner* — Joseph Schoenholtz
(74) *Attorney, Agent, or Firm* — Winston Hsu; Scott Margo

(57) ABSTRACT

A high voltage metal-oxide-semiconductor (HV MOS) device includes a substrate including a first conductivity type, a gate positioned on the substrate, a drain region formed in the substrate, the drain region including a second conductivity type, and a source region formed in the substrate, where the source region includes at least one first part and at least one second part, the first part includes the second conductivity type, the second part includes the first conductivity type, and the first conductivity type and the second conductivity type are complementary.

11 Claims, 4 Drawing Sheets

HIGH VOLTAGE METAL-OXIDE-SEMICONDUCTOR TRANSISTOR DEVICE

BACKGROUND OF THE INVENTION

1. Field of the Invention

The invention relates to a high voltage metal-oxide-semiconductor (herein after abbreviated as HV MOS) device, and more particularly, to a high voltage lateral double-diffused metal-oxide-semiconductor (HV-LDMOS) device.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantages of higher operational bandwidth, higher operational efficiency, and convenience to be integrated with other integrated circuit due to its planar structure, LDMOS transistor devices are prevalently used in high operational voltage environments such as CPU power supply, power management system, AC/DC converter, and high-power or high frequency (HF) band power amplifier. The essential feature of LDMOS transistor device is a lateral-diffused drift region with low dope concentration and large area. The drift region is used to alleviate the high voltage between the drain and the source, therefore the LDMOS transistor device can have higher breakdown voltage.

It is well-known that characteristics of low RON and high breakdown voltage are always required to the HV MOS transistor device. However, breakdown voltage and RON are conflicting parameters with a trade-off relationship. Therefore, a HV LDMOS transistor device that is able to realize high breakdown voltage and low RON is still in need. In addition, the electrostatic discharge (ESD) may also influence the performance of a LDMOS, so decreasing the ESD damage of a LDMOS is an important issue for researching.

SUMMARY OF THE INVENTION

One purpose of the present invention is providing a HV MOS transistor device with low RON and high breakdown voltage, and further decreasing the ESD damage of a HV MOS.

The present invention provides a high voltage metal-oxide-semiconductor (HV MOS) device including a substrate including a first conductivity type, a gate positioned on the substrate, a drain region formed in the substrate, the drain region including a second conductivity type, and a source region formed in the substrate, wherein the source region includes at least one first part and at least one second part, the first part includes the second conductivity type, the second part includes the first conductivity type, and the first conductivity type and the second conductivity type are complementary.

Compared with conventional HV MOS, the source region of the HV MOS of the present invention is composed of two parts with different conductivity types. More precisely, the source region of the present invention comprises the first part and the second part, and the first part and the second part have complementary conductivity types. Therefore, since the high voltage current that is transmitted from the drain region to the source region is dispersed, the current flow passing through the source region can be decreased, thereby avoiding the ESD damage happened and improving the reliability of the HV MOS.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
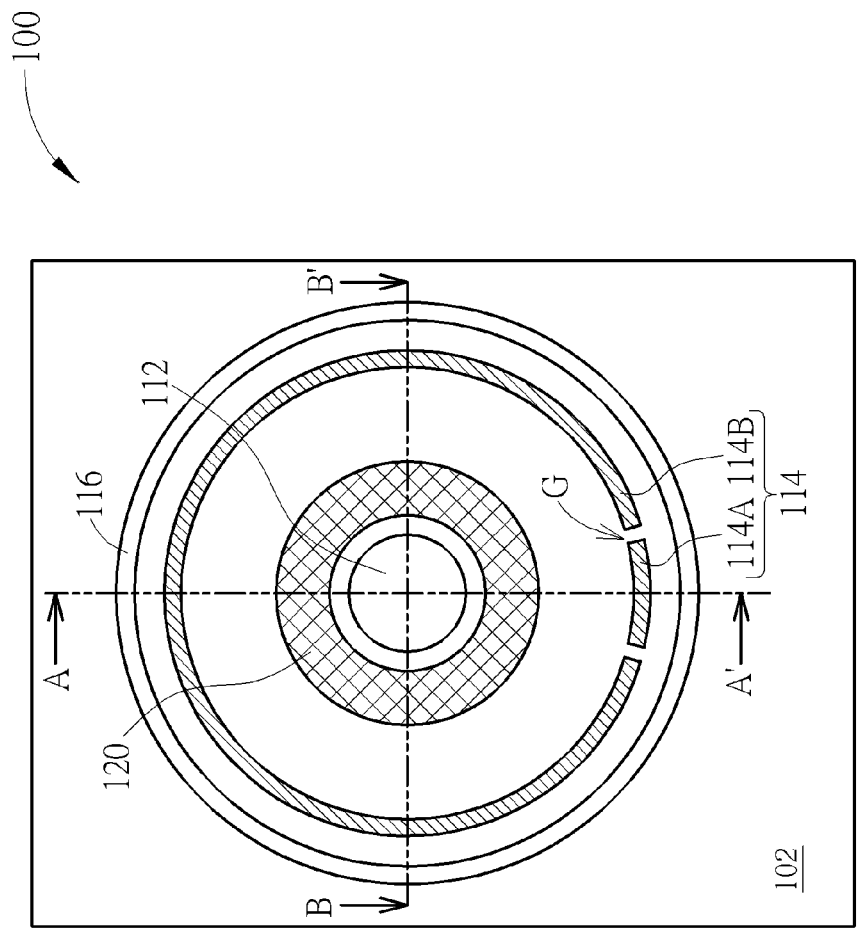
FIG. 1 is a schematic drawing of a layout pattern of a HV MOS transistor device provided by a first preferred embodiments of the present invention.
Figure 2:
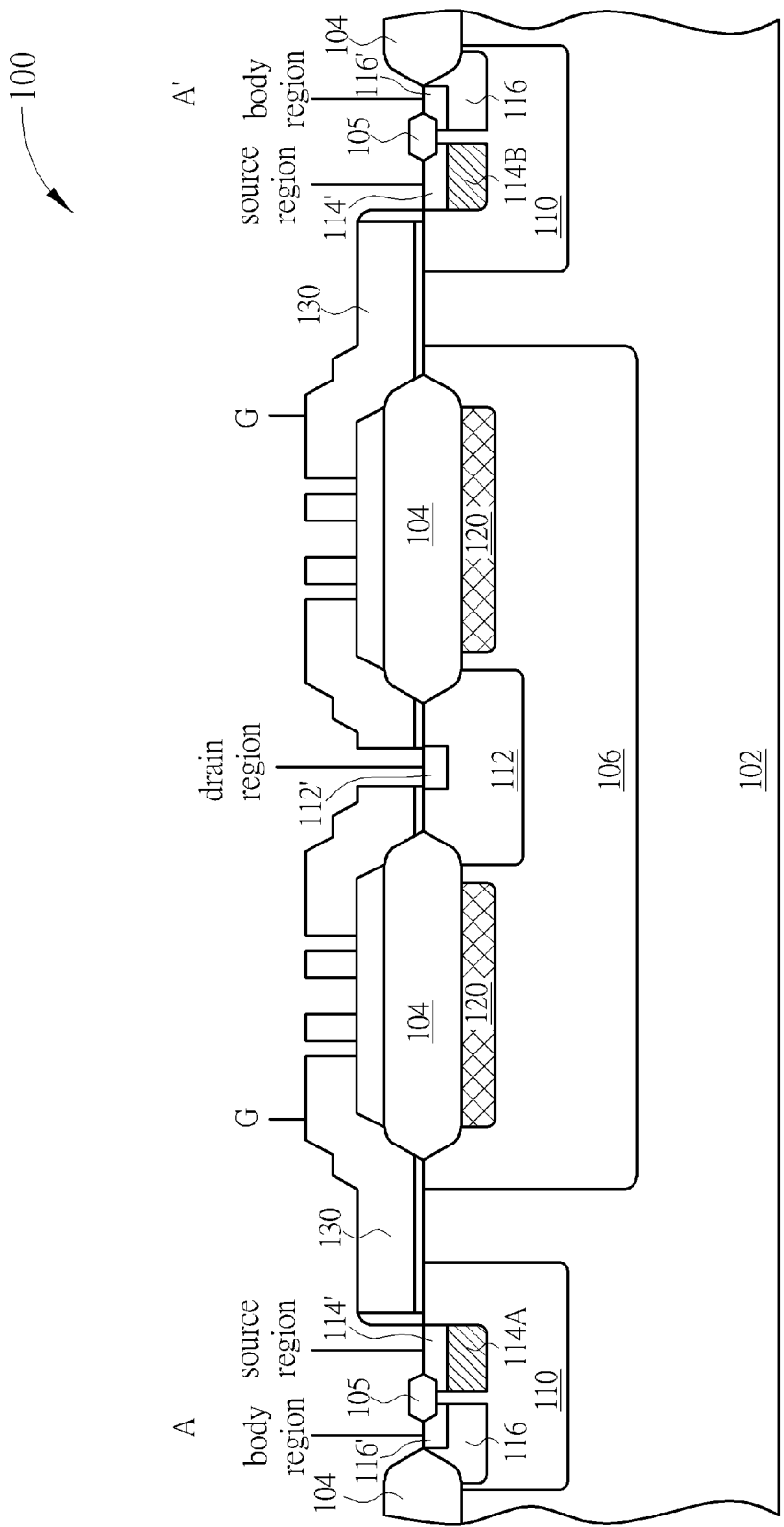
FIG. 2 is a cross-sectional view of the HV MOS transistor device provided by the first preferred embodiment of the present invention taken along line A-A' of FIG. 1.
Figure 3:
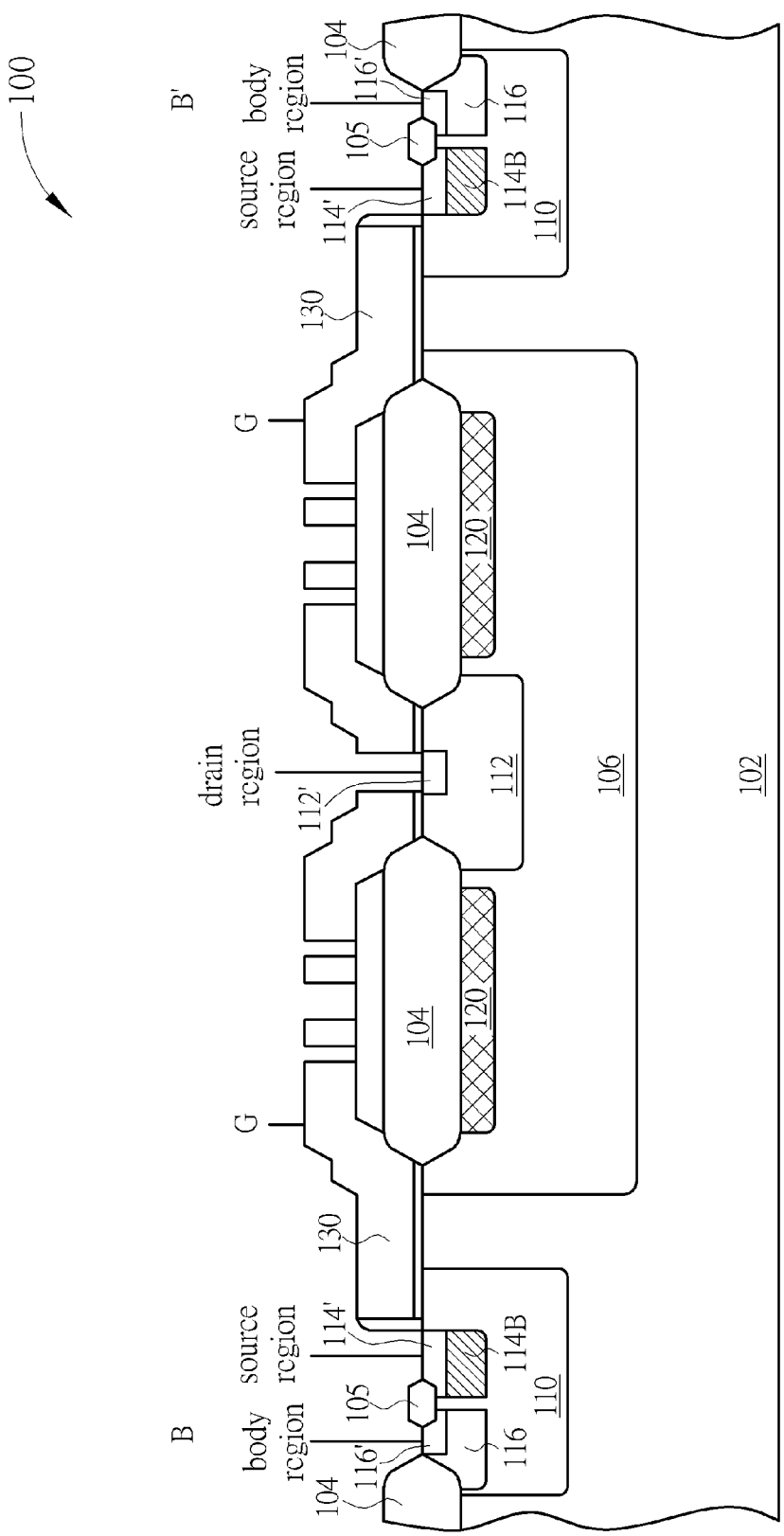
FIG. 3 is a cross-sectional view of the HV MOS transistor device provided by the first preferred embodiment of the present invention taken along line B-B' of FIG. 1.

Please refer to FIGS. 1-3, FIG. 1 is a schematic drawing of a layout pattern of a HV MOS transistor device provided by a first preferred embodiment of the present invention, FIG. 2 is a cross-sectional view of the HV MOS transistor device provided by the first preferred embodiment taken along line A-A' of FIG. 1; FIG. 3 is a cross-sectional view of the HV MOS transistor device provided by the first preferred embodiment taken along line B-B' of FIG. 1. As shown in FIGS. 1-3, a HV MOS transistor device 100 provided by the preferred embodiment is positioned in a substrate 102, such as a silicon substrate. The substrate 102 includes a first conductivity type. In the preferred embodiment, the first conductivity type is p type. The HV MOS transistor device 100 further includes an insulating layer 104, such as a filed oxide (FOX) or a shallow trench isolation (STI). It is noteworthy that for clarifying spatial relationships between certain specific doped regions of the HV MOS transistor device 100, the insulating layer 104 is omitted from FIG. 1. However, those skilled in the art would easily realize the location where the insulating layer 104 is to be formed according to FIG. 2 and FIG. 3.

Please still refer to FIGS. 1-3. The HV MOS transistor device 100 provided by the first preferred embodiment further includes a deep well 106 having a second conductivity type. The second conductivity type and the first conductivity type are complementary to each other. Accordingly, the second conductivity type is n type in the preferred embodiment. A drift region (not shown) is formed in the deep well 106. The drift region includes the second conductivity type, and the high-voltage well region 110 includes the first conductivity type. A drain doped region 112 is formed in the n-type drift region while a source doped region 114 and a body doped region 116 are formed in the p-type high-voltage well region 110. The drain doped region 112 includes the second conductivity type and serve as an n-type drain (n-drain) region 112 for the HV MOS transistor device 100. The source region 114 of the present invention includes two parts: a first part 114A and a second part 114B, where the first part 114A includes the second conductivity type, and the second part 114B includes the first conductivity type. For example, in this embodiment, the first conductivity type is n-type, and the second conductivity type is p-type. Others features of the source region 114 will be described in the following paragraphs. The body doped region 116 includes the first conductivity type and thus serves as a p-type body (p-body) region 116 for the HV MOS transistor device 100. As shown in FIGS. 1-3, the source region 114 and the body region 116 are not overlapped with each other, and an insulating layer 105 is disposed therebetween, to electrically isolate them to each other. The insulating layer 105 such as a field oxide (FOX) layer, or a shallow trench isolation (STI). Furthermore, a drain contact 112', a source contact 114', and a body contact 116' can be formed respectively in the n-drain region 112, the n-source region 114, and the p-body region 116.

The HV MOS transistor device 100 also includes a gate 130. The gate 130 is omitted from FIG. 1 in order to clarify spatial relationships between certain specific doped regions of the HV MOS transistor device 100. However those skilled in the art would easily realize the location where the gate 130 is to be formed according to FIGS. 2-3. As shown in FIGS. 2-3, the gate 130 is positioned on the substrate 102 and covers a portion of the insulating layer 104.

Please still refer to FIGS. 2 and 3. The HV MOS transistor device 100 provided by the preferred embodiment further includes a first doped region 120. As shown in FIGS. 2 and 3, the first doped region 120 is positioned in between the drain region 112 and the source region 114. The drain region 112, the source region 114, and the first doped region 120 formed in the deep well 106 are not only spaced apart from each other, but also electrically isolated from each other by the deep well 106. The first doped region 120 includes the first conductivity type. Therefore the first doped region 120 is a p-doped region. According to the preferred embodiment, the width of the p-type first doped region 120 is smaller than the width of the insulating layer 104, being formed under the insulating layer 104 and complementary to the n-first part 114A of the source region 114 and the n-drain region 112, so as to increases the resistance of the HV MOS transistor device 100. When high voltage signal (HV signal) passes through the p-type first doped region 120, the voltage step-down ability of the HV MOS transistor device 100 is consequently improved and the acceptable lower voltage signal is obtained. In other words, by providing the p-type first doped region 120, the breakdown voltage of the HV MOS transistor device 100 is efficaciously increased.

The feature of the present invention is shown in FIG. 1, where the source region 114 comprises a first part 114A and a second part 114B. Besides, in the present invention, the source region 114 is a ring-shaped structure, both the first part 114A and the second part 114B are arc-shaped structures, the first part 114A does not contact the second part 114B directly, and at least two gaps G are disposed between the first part 114A and the second part 114B. More precisely, the ring-shaped structure source region 114 is mainly composed of the first part 114A and the second part 114B. In other words, the first part 114A and the second part 114B are arranged in a ring-shaped, and include at least two gaps. In addition, when viewed in top view, the total area of the p-type doped second part 114B is larger than the total area of the n-type doped first part 114A.

In the conventional process, the source region of a HV MOS may be an enclosed n-type doped ring-shaped structure. In other words, the source region has only one conductivity type (such as n-type). When the high-voltage current transmits from the drain region to the source region, the electrostatic discharge (ESD) easily occurs due to large amount of the high voltage current passing through the path, thereby influencing the performance of the HV MOS. In the present invention, more than half of the source region 114 is the p-type doped second part 114B, and only the remaining part that is less than half of the source region 114 is the n-typed doped first part 114A, where the first part 114A can be used as the "exit" of the current path. In other words, the high voltage current only passes through the n-type doped first part 114A, but does not pass through the p-type doped second part 114B. And at this time, others high voltage currents can be extracted from the body region 116 which are disposed beside the second part 114B. In this way, since the n-type doped first part 114A of the present invention only occupy a relative smaller area of total area of the source region 114, the exit area of the current path is decreased, and the high voltage current can be decreased or can be controlled too, thereby decreasing the ESD that occurs.

The area of the first part 114A and the second part 114B of the source region 114 directly influence the detected signal magnitude of the HV MOS. If the total area of the first part 114A is too large, the HV MOS cannot control the ESD well, but if the area of the second part 114B is too small, the signal of the HV MOS becomes decreased and cannot be detected easily. Therefore, in the present invention, the n-type doped second part 114B occupies 180 degrees to 330 degrees of the total center angles. In other words, the ratio of the total area of second part 114B to the total area of the source region 114 is preferably between 1/2-11/12. When this relationship is satisfied, the disadvantages mentioned above can be avoided.

Figure 4:
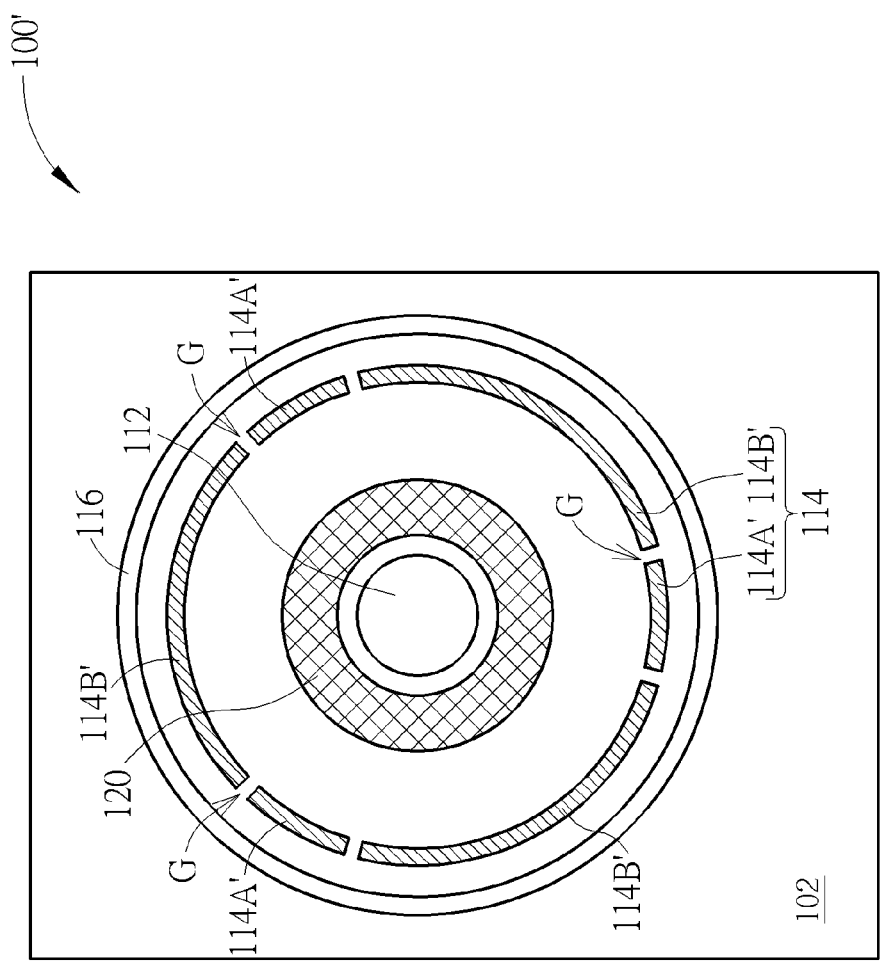
FIG. 4 is a schematic drawing of a layout pattern of a HV MOS transistor device provided by a second preferred embodiments of the present invention.

In the first preferred embodiment of the present invention mentioned above, one ring-shaped source region 114 only includes one first part 114A and one second part 114B respectively. But in another embodiment of the present invention, one ring-shaped source region 114 may comprise more than one first parts and second parts. Please refer to FIG. 4. FIG. 4 is a schematic drawing of a layout pattern of a HV MOS transistor device provided by a second preferred embodiment of the present invention. In this embodiment, the source region 114 of the HV MOS 100' is a non-continuous doped region, and it may include a plurality of first part 114A' and a plurality of second parts 114B'. Similarly, each first part 114A' does not contact each second part 114B directly. Besides, a plurality of gaps G is disposed the first part 114A' and the second part 114B'. However, this embodiment also satisfies the condition that the ratio of the total area of the second parts 114B' to the total area of the source region 114 is between 1/2-11/12. It can be understood that the shape and the amount of the first parts 114A' or the second parts 114B are not limited to this embodiment, and they can be adjusted according to actual requirements.

In addition, the source region 114 and the body region 116 mentioned above that surrounds the drain region 112 is a ring-shaped structure. But in another embodiment of the present invention, those elements can be a frame-shaped structure, a racetrack-shaped structure, a polygon shaped structure or others suitable shaped structures. Preferably, these elements are symmetrical structures.

In summary, compared with conventional HV MOS, the source region of the HV MOS of the present invention is composed of two parts with different conductivity types. More precisely, the source region of the present invention comprises the first part and the second part, and the first part and the second part have complementary conductivity types. Therefore, since the high voltage current that is transmitted from the drain region to the source region is dispersed, the current flow passing through the source region can be decreased, thereby avoiding the occurrence of ESD and improving the reliability of the HV MOS.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high voltage metal-oxide-semiconductor (HV MOS) transistor device comprising:
   a substrate having a first conductivity type;
   a gate disposed on the substrate;
   a drain region formed in the substrate, the drain region having a second conductivity type complementary to the first conductivity type;
   a source region formed in the substrate, wherein the source region comprises at least one first part and at least one second part, the first part has the second conductivity type, the second part has the first conductivity type, and the first part is separated from the second part by an insulator;
   a high-voltage well region, the high-voltage well region having the first conductivity type; and
   a body region and the source disposed within the high-voltage well region.

2. The HV MOS of claim 1, wherein the source region is a ring-shaped structure, and both the first part and the second part are arc-shaped structures.

3. The HV MOS of claim 1, wherein the total area of the second part is larger than the total area of the first part.

4. The HV MOS of claim 3, wherein the ratio of the total area of the second part to the total area of the source region is between 1/2-11/12.

5. The HV MOS of claim 1, further comprising a deep well region, the deep well region having the second conductivity type.

6. The HV MOS of claim 5, wherein both the drain region and a first doped region are disposed within the deep well region.

7. The HV MOS of claim 1, wherein the source region is disposed within the high-voltage well region.

8. The HV MOS of claim 1, wherein the body region does not overlap with the source region.

9. The HV MOS of claim 1, further comprising an insulation layer disposed between the body region and the source region.

10. The HV MOS of claim 1, wherein the source region is a non-continuous doped region, and includes a plurality of gaps.

11. The HV MOS of claim 1, further comprising a first doped region disposed between the source region and the drain region, the first doped region has the first conductivity type.

* * * * *